(12) United States Patent
Cooke

(10) Patent No.: US 10,170,177 B2
(45) Date of Patent: Jan. 1, 2019

(54) MANUFACTURE OF A TUNNEL DIODE MEMORY

(71) Applicant: Laurence H. Cooke, Los Gatos, CA (US)

(72) Inventor: Laurence H. Cooke, Los Gatos, CA (US)

(*) Notice: Subject to any disclaimer, the term of this patent is extended or adjusted under 35 U.S.C. 154(b) by 175 days.

(21) Appl. No.: 15/174,015

(22) Filed: Jun. 6, 2016

(65) Prior Publication Data

US 2017/0025166 A1 Jan. 26, 2017

Related U.S. Application Data

(62) Division of application No. 13/927,835, filed on Jun. 26, 2013, now Pat. No. 9,391,161.

(51) Int. Cl.

| | |
|---|---|
| *G06F 12/00* | (2006.01) |
| *G11C 11/419* | (2006.01) |
| *H01L 29/66* | (2006.01) |
| *H01L 27/02* | (2006.01) |
| *H01L 27/102* | (2006.01) |
| *G11C 11/418* | (2006.01) |
| *H01L 27/06* | (2006.01) |
| *H01L 49/02* | (2006.01) |

(52) U.S. Cl.
CPC .......... *G11C 11/419* (2013.01); *G11C 11/418* (2013.01); *H01L 27/0207* (2013.01); *H01L 27/0676* (2013.01); *H01L 27/1021* (2013.01); *H01L 29/66151* (2013.01); *H01L 28/40* (2013.01)

(58) Field of Classification Search
CPC . G11C 11/418; G11C 11/419; H01L 27/0207; H01L 27/0676; H01L 27/1021; H01L 28/40; H01L 29/66151
See application file for complete search history.

(56) References Cited

U.S. PATENT DOCUMENTS

| | | | |
|---|---|---|---|
| 3,120,653 A | 2/1964 | Miller et al. | |
| 3,196,405 A | 7/1965 | Gunn | |
| 4,573,143 A | 2/1986 | Matsukawa | |
| 5,267,193 A | 11/1993 | Lin | |
| 7,421,563 B2 | 9/2008 | Cooke | |
| 9,391,161 B2 | 7/2016 | Cooke | |
| 2003/0019568 A1 | 1/2003 | Liu et al. | |
| 2005/0167656 A1 | 8/2005 | Sun et al. | |
| 2005/0258492 A1* | 11/2005 | Chaudhry | G11C 16/0433 257/369 |
| 2008/0258952 A1* | 10/2008 | Maezawa | H03M 3/458 341/143 |

OTHER PUBLICATIONS

Office Action dated Jun. 16, 2015 in U.S. Appl. No. 13/927,835 by Cooke.

* cited by examiner

*Primary Examiner* — Yong J Choe

(74) *Attorney, Agent, or Firm* — Panitch Schwarze Belisario & Nadel LLP

(57) ABSTRACT

A design of a non-transistor memory core with corresponding shift register control logic may be all comprised of tunnel diodes and capacitors, and a method for fabricating such memories and control logic may use a stencil and non-lithographic self-aligning semiconductor processing steps to minimize cost. Designs and fabrication processes for I/O pads connected to the memory core and control logic are also presented.

5 Claims, 23 Drawing Sheets

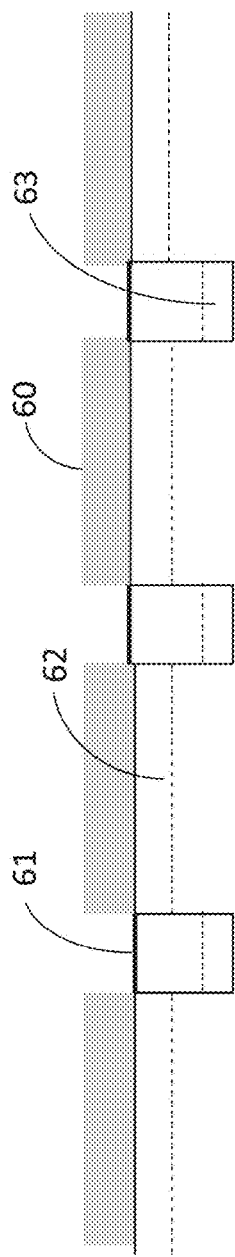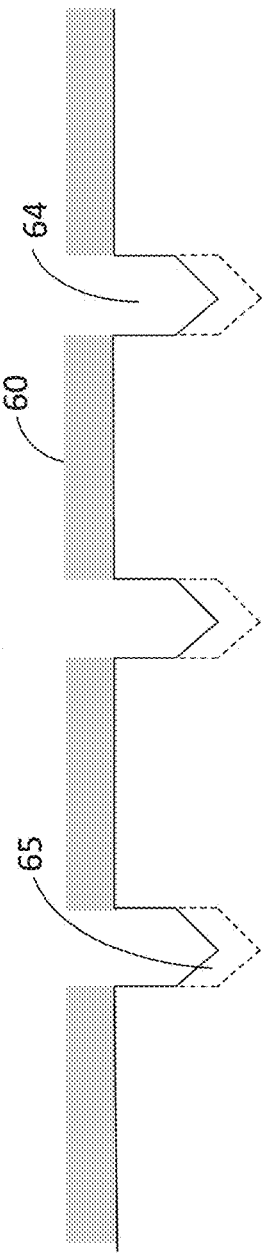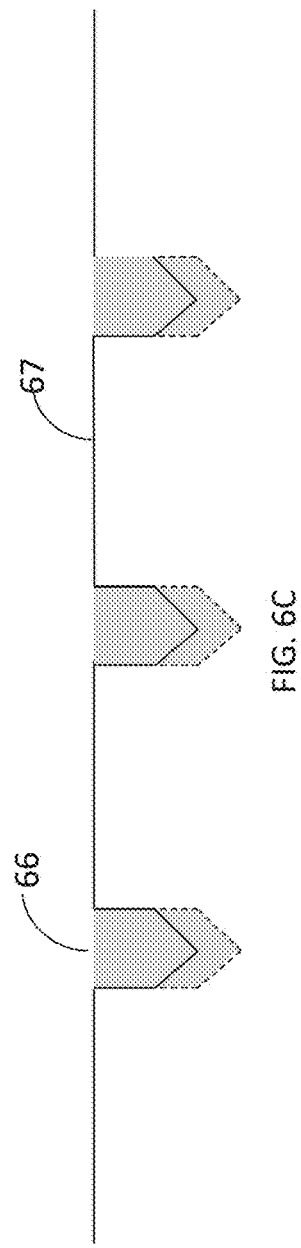

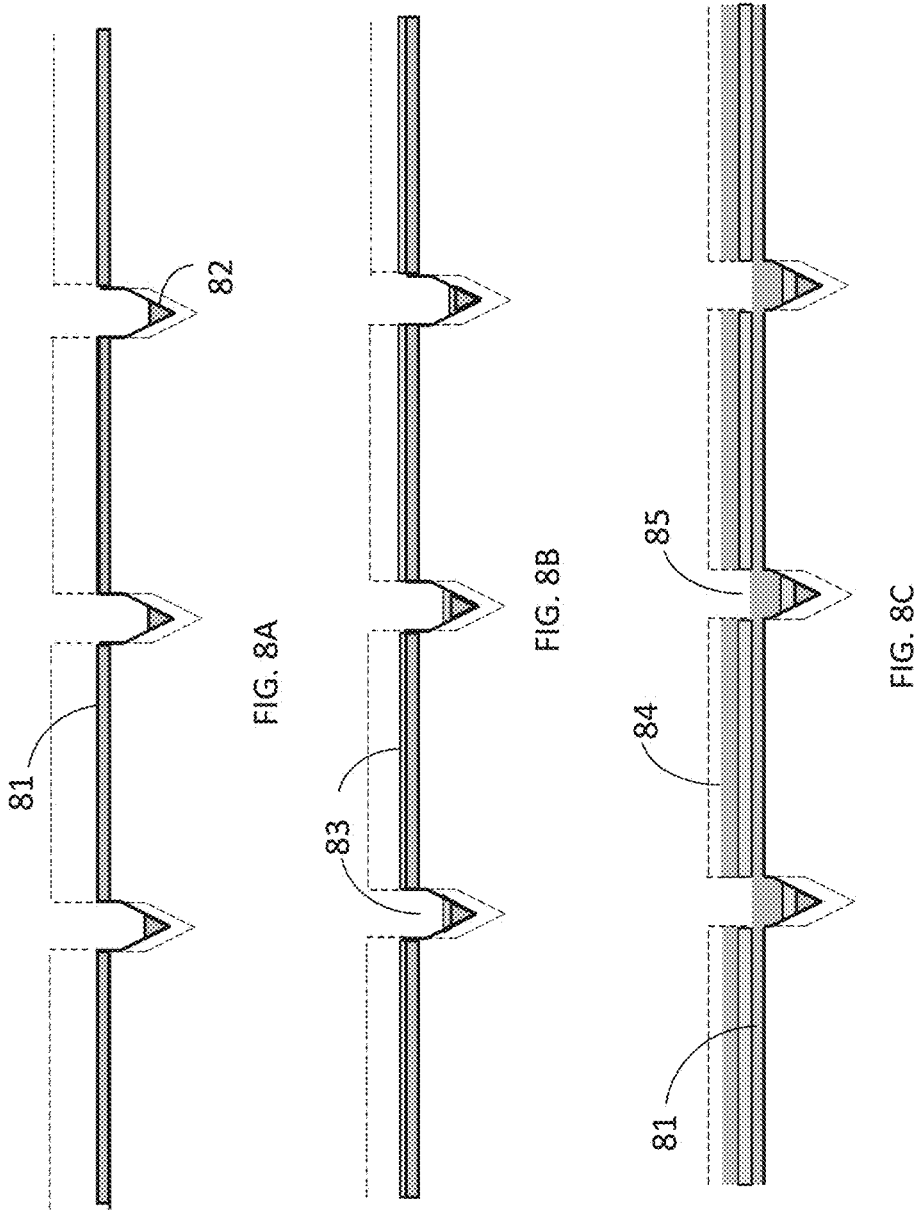

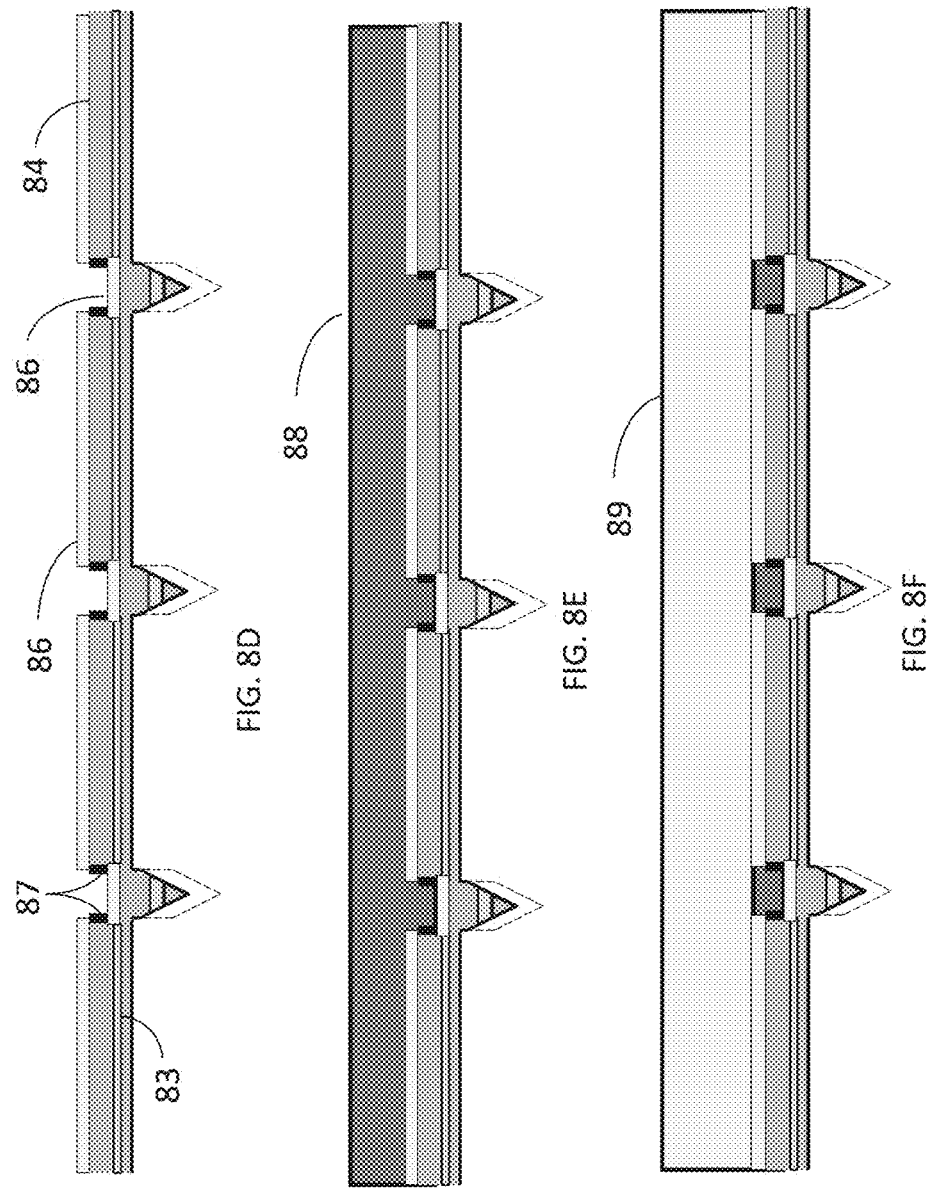

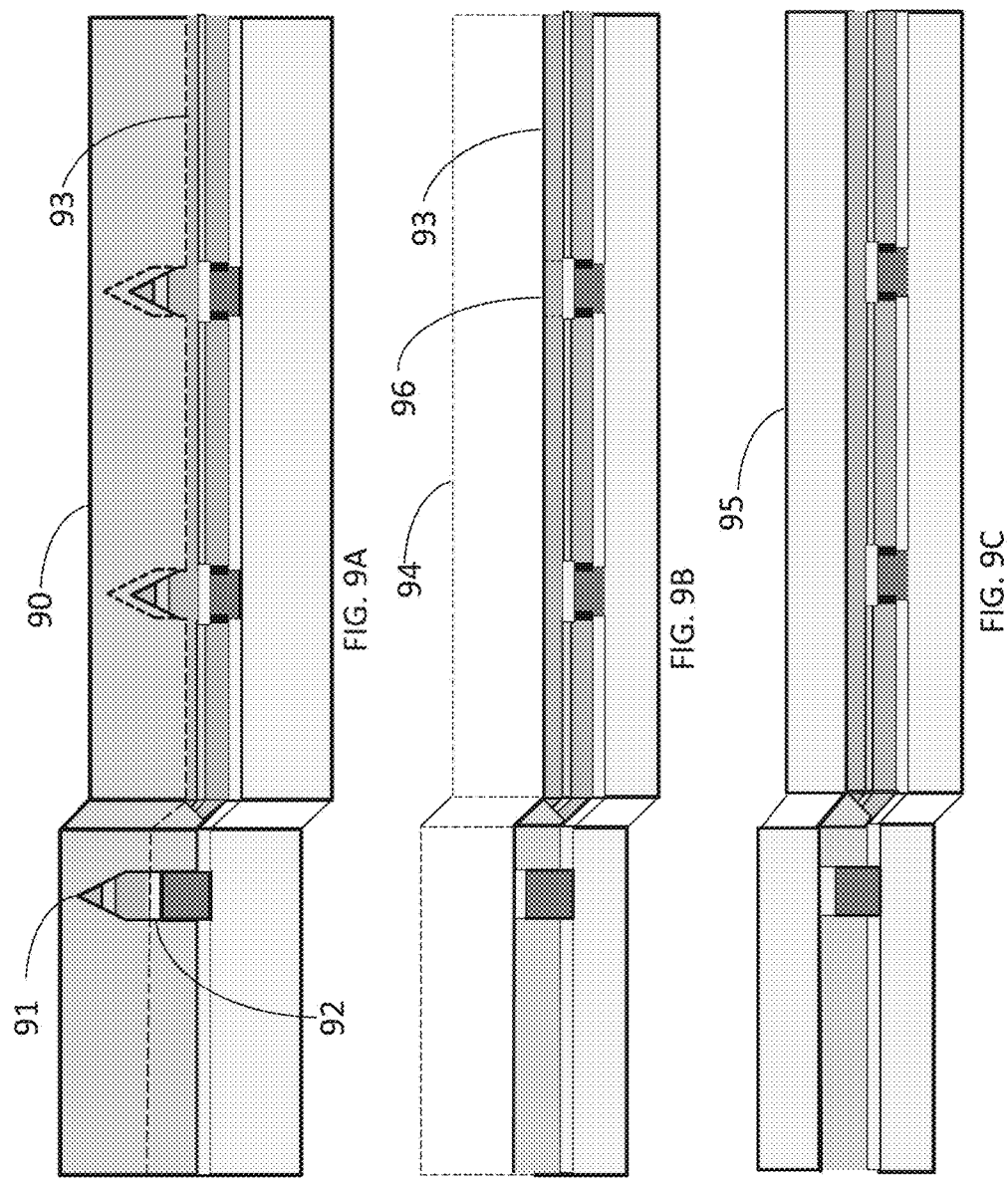

MANUFACTURE OF A TUNNEL DIODE MEMORY

CROSS-REFERENCE TO RELATED APPLICATIONS

This application is a divisional of U.S. patent application Ser. No. 13/927,835, filed Jun. 26, 2013, the contents of which are incorporated herein by reference.

FIELD OF THE INVENTION

Embodiments of the present invention may pertain to the design and manufacture of a high frequency, high density SRAM memory array comprised of tunnel diodes with capacitive coupling to data lines.

BACKGROUND OF THE INVENTION

Many tunnel diode memory designs have been previously described. Miller et al., in U.S. Pat. No. 3,120,653, granted Feb. 4, 1964, described pairs of tunnel diodes resistively coupled to data lines, which may be used to program the tunnel diode "latch" by "clocking" the power supply. Matsukawa, in U.S. Pat. No. 4,573,143, granted Feb. 25, 1986, describes pairs of tunnel diodes being programmed with data lines coupled to perpendicular word line gated transistors. Lin, in U.S. Pat. No. 5,267,193, granted Nov. 30, 1993, describes a multi-valued memory cell consisting of two pairs of back-to-back tunnel diodes in series. In spite of their compact size and their high speed, in the past, pairs of tunnel diodes may have been difficult to electrically match, making defect-free large memories difficult to manufacture.

Capacitive coupling to data lines has been previously described by Gunn in U.S. Pat. No. 3,196,405, granted Jul. 20, 1965, where each bit of memory consists of pairs of regular semiconductor diodes sandwiched between a capacitor connected to a data line. Such a structure made use of the variable capacitance of the diode pairs to hold bit values as a capacitive charge in a manner, which may be similar to some Dynamic Random Access Memory (DRAM) designs, whereas the negative resistance characteristic of tunnel diode designs may form "latches" in a manner analogous to Static Random Access Memories (SRAMs).

The inventor, in U.S. patent application Ser. No. 13/454,155, filed Apr. 24, 2012, describes a solar array comprised of an array of visible light wavelength antennas coupled to pairs of ultrahigh speed rectifying tunnel diodes, and the fabrication of such a structure may be comprised entirely of successive depositions and etches performed on a preconfigured stencil, eliminating masking variations, which may thereby minimize the variations in the electrical characteristics of the pairs of diodes. Given the potential high performance, high density and low manufacturing cost, it therefore may be desirable to apply the inventor's techniques to the design and fabrication of a tunnel diode memory.

SUMMARY OF EMBODIMENTS OF THE INVENTION

Therefore, various embodiments of the invention may relate to the structure, operation and/or economical manufacture of dense, high-speed tunnel diode memory cores and their associated control logic.

In one embodiment of the present invention, a memory bit may comprise two tunnel diodes serially connected between two separate voltage lines and coupled to a data line through a capacitor.

In another embodiment of the present invention, a memory core may be comprised of a plurality of memory bits connected in a two-dimensional array by a plurality of parallel data lines, and a plurality of alternating ground, and clock lines that are perpendicular to the data lines.

In another embodiment a stencil may be fabricated, using a combination of vertical and V-groove etching, for repeated use in constructing memory cores without the use of masks.

In another embodiment, a memory core may be comprised of two perpendicular layers of electrically separate parallel conductive lines coupled to an array of internal nodes by diodes and capacitors and may be fabricated without masks by depositing, etching and polishing successive layers of material on a stencil.

In another embodiment, I/O pads may be created for the clock, ground and/or data lines using a similar process of depositing, etching and polishing successive layers of material on a stencil as was used to create the memory core. The I/O pads may be constructed using a stencil, such that after removing it from the stencil, polishing, applying a protective layer and adding solder bumps may then be performed to the I/O pads to attach the memory core to other electronics.

In another embodiment, both the clock and the ground lines may be used to independently write each row of bits in the memory.

In yet another embodiment, to minimize the number of pads required for the memory core, the control logic may be constructed around the core. Such logic may be tunnel diode logic, which may be constructed on the same stencil as may be used to form the memory core. Such control logic may consist of two parts, one part for the data lines and a different part for each of the clock and ground lines. The data control logic may comprise at least one shift register, connected to at least two levels of buffers, which in turn may be connected to the data lines of the memory core. Such control logic may be able to both write data into and read data out of the memory core using few external signals. When reading or writing a line of data in the memory core, ⅔ of the data may be shifted into or out of the control logic twice, and ⅓ of the data may be read or written into or out of the buffers twice. The redundant data read out of the memory may be compared with the original data to check the operation of the memory and control logic. The number of shift clocks may be varied to randomly select which ⅓ of the original data to duplicate. Furthermore, the data may be continuously checked as a test of the operation of the memory. Alternatively, the data may be encoded such that any ⅔ of the data may be sufficient to reconstruct the entire line of data, and all reads may be performed in a single pass of the shift register. The control logic for the clock or ground lines each may comprise a circular shift register formed onto a serial decoder, connected to at least two levels of buffers, which in turn may be connected to the clock or ground lines. In this manner, the number of external signals may be determined by the structure of the control logic, not the size of the memory core.

In another embodiment, structures may be created on a stencil to allow at least one conductive layer to connect to another conductive layer or to cross over another conductive layer, or to be segmented above another conductive layer, all without using vias or masks.

BRIEF DESCRIPTION OF THE DRAWINGS

Various embodiments of the invention will now be described in connection with the attached drawings, in which:

FIGS. 6A, 6B, and 6C are Y-direction cross-sections of a stencil during its fabrication, according to an embodiment of the invention, FIGS. 8A through 8F are Y-direction cross-sections of a memory core during fabrication on a stencil, according to an embodiment of the invention, FIGS. 9A, 9B, and 9C are adjacent connected Y-direction cross-sections of a memory core during its fabrication after removal from a stencil, according to an embodiment of the invention.

DESCRIPTION OF VARIOUS EMBODIMENTS

Embodiments of the present invention are now described with reference to FIGS. 1-25, it being appreciated that the figures may illustrate the subject matter of various embodiments and may not be to scale or to measure.

Figure 1:
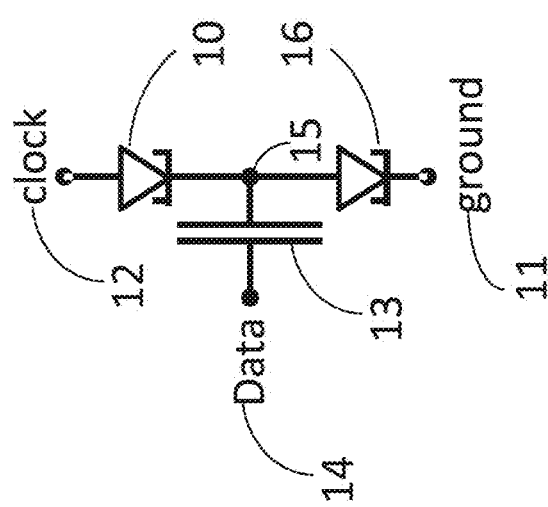
FIG. 1 is a diagram of a single bit of tunnel diode memory according to an embodiment of the invention.

In one embodiment of the present invention, a memory bit may be comprised of two tunnel diodes serially connected between two conductive lines and coupled to a data line through a capacitor. Reference is now made to FIG. 1, a diagram of a single bit of tunnel diode memory according to an embodiment of the invention. Each bit of a tunnel diode memory in this embodiment may contain two tunnel diodes 10, with one connected to a ground 11 line and the other connected to a clock 12 line. A capacitor 13 may connect to a data line 14 and to the pair of tunnel diodes 10 and 16 through an internal node 15.

Figure 2:
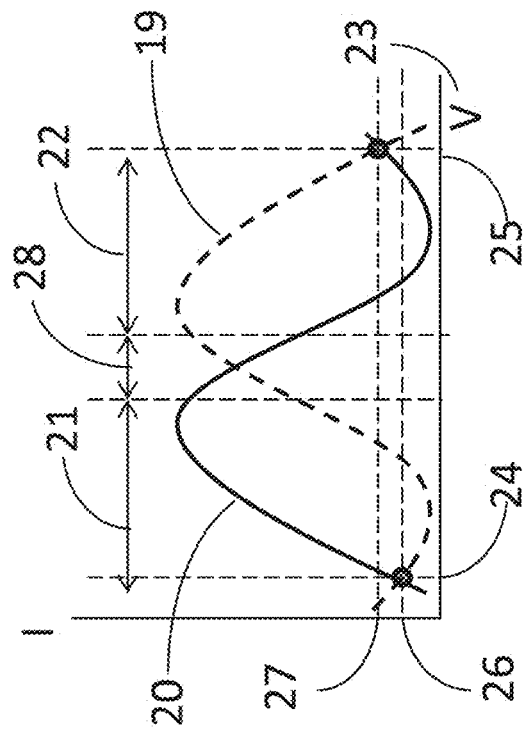
FIG. 2 is a diagram of current-voltage (I-V) curves of the tunnel diodes in the tunnel diode memory bit, according to an embodiment of the invention.

Reference is now made to FIG. 2, a diagram of the current-voltage (I-V) curves of tunnel diodes in a tunnel diode memory bit, according to an embodiment of the invention. The solid curve 20 may represent the operation of the upper tunnel diode 10 relative to the internal node 15, both in FIG. 1, and the dashed curve 19 may represent the operation of the lower diode 16 relative to the internal node 15, both in FIG. 1. Superimposing the two curves 19 and 20 on the same graph may illustrate the bi-stable nature of the circuit. The points of intersection [24,26] and [25,27] may represent points of equivalent current flowing into and out of the internal node 15 in FIG. 1. While the ground remains at zero, to reset the state of the memory bit, the voltage 23 on the clock may be reduced to zero. When the voltage on the clock is increased, if the voltage on the internal node is within the lower range 21 relative to the voltage 23 on the clock, the internal node may maintain the low voltage 24 with low current 26. If the voltage on the internal node is within the upper range 22 the internal node may maintain the high voltage 25 with similar current 27. If the mid voltage range 28 is relatively narrow, this bi-stable structure may allow the data line to control the state set on each bit of memory by coupling onto the internal node through the capacitor while the voltage on the clock is rising.

Figure 3:
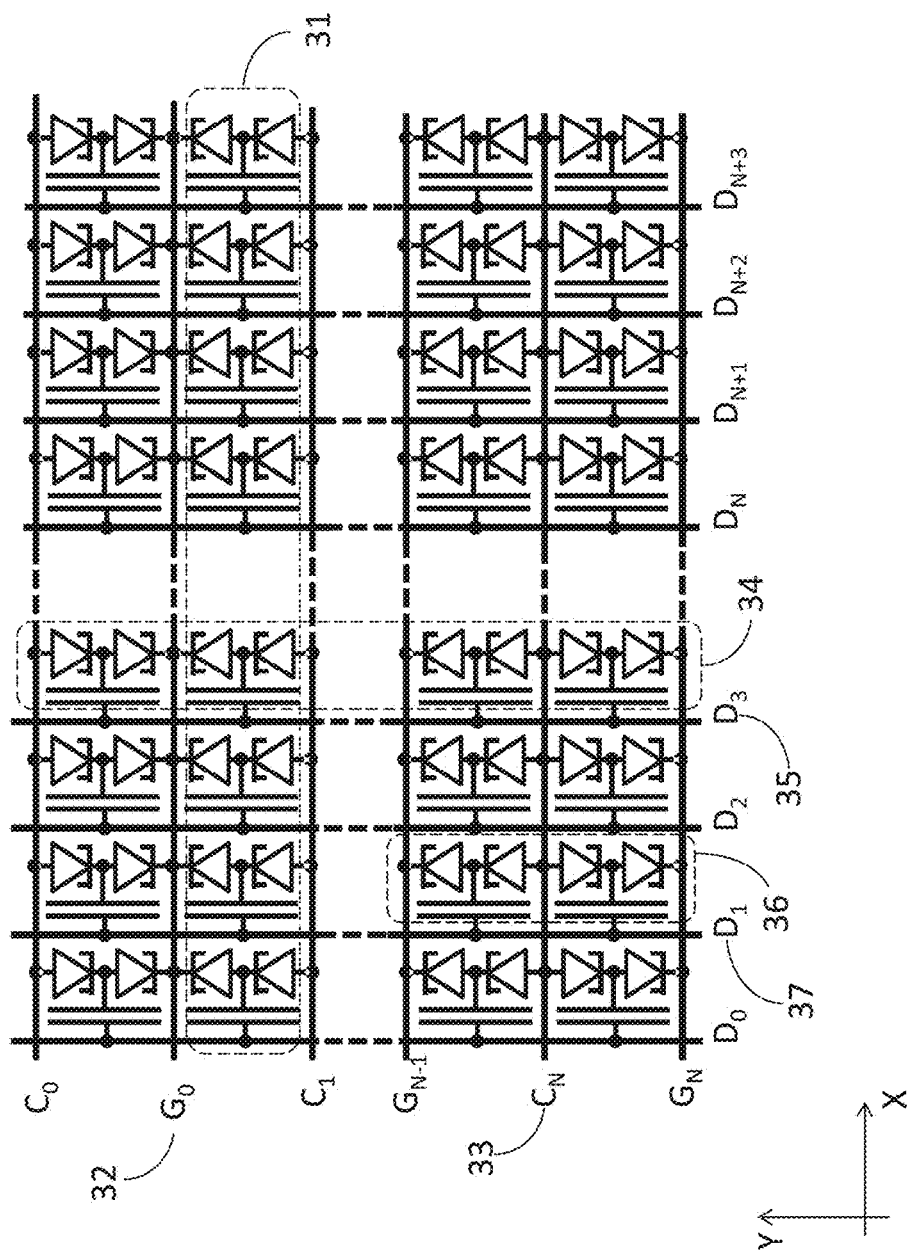
FIG. 3 is a diagram of a tunnel diode memory core, according to an embodiment of the invention.

In another embodiment of the present invention, a memory bit may be comprised of two tunnel diodes serially connected between two voltage lines and between a capacitive connection to a data line, and may be connected in a two-dimensional array by a plurality of parallel alternating ground and clock lines and a plurality of data lines that may be arranged perpendicularly with respect to the ground and clock lines. Reference is now made to FIG. 3, a diagram of a tunnel diode memory core, according to an embodiment of the invention. Adjacent rows of memory bits 31 in the Y-direction may alternate the Y-direction orientations of their associated tunnel diodes such that two adjacent rows of the tunnel diode memory may connect to a common ground line 32 or common clock line 33, which may extend in the X-direction between two adjacent rows of bits. Each column of the memory bits 34 may be connected to a common data line 35, which may extend across all rows in the Y-direction.

In this manner, each Y-direction adjacent pair of memory bits 36 may be simultaneously read and/or set by its common clock line 33.

Figure 4:
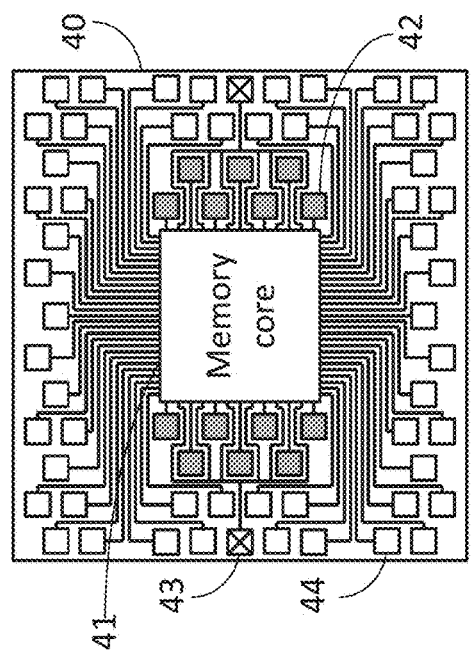
FIG. 4 is a diagram of bonding pads of a diode memory core, according to an embodiment of the invention.

Reference is now made to FIG. 4, a diagram of bonding pads 40 extending from a diode memory core 41, according to an embodiment of the invention. Alternating ground lines may be connected to a common ground pad 43 on each side of the memory core 41. Alternating clock lines may be connected to individual pads 42 on each side of the memory core 41. The data lines may also be connected to individual pads 44 around the memory core. To limit the capacitance on each data line, the core may be constructed with more data lines than clock and ground lines. Given a larger difference in spacing between signal lines versus between pads, and the single-layer structure of the wiring to the pads, the area required for the pads may be quite large in relation to the memory core. Alternatively, control logic may be employed to reduce the number of pads.

Figure 5:
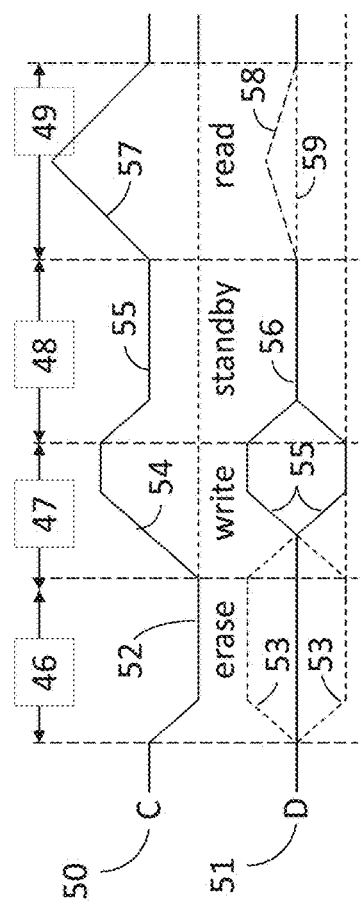
FIG. 5 is a timing diagram of the clock and data signals as may be applied to a tunnel diode memory.

Reference is now made to FIG. 5, a timing diagram of the clock and data signals, which may be applied to a tunnel diode memory, specifically to a pair of tunnel diode memory bits driven by both the clock 50 and data 51 signals. Initially, during an erase operation 46, the bits may be cleared by dropping the clock line to a low voltage 52. During a write operation 47, which may follow an erase operation, the voltage level on the clock 54 may be raised while the data line voltage may be transitioned from a mid voltage level to either a high or low voltage level 55. This may result in either keeping the internal nodes 15, shown in FIG. 1, within the lower voltage range 21, shown in FIG. 2, when the data and clock voltages may transition in opposite directions, or may result in keeping the internal nodes 15 within the upper voltage range 22, shown in FIG. 2, when the data and clock voltages may transition in the same direction. Given the capacitor 13, shown in FIG. 1, may be relatively small, or the mid voltage range 28 shown in FIG. 2 may be relatively large, the data line may need to transition to the opposite state 53 during the clear operation 46 in order for the subsequent transition 55 during the write operation 47 to sufficiently affect the internal nodes 15, shown in FIG. 1. Once the bits have been set, static power may be lowered in a standby operation 48 by lowering the clock voltage 55. Given no other operations may be occurring, the data lines may also be transitioned to a mid voltage 56, in preparation for a subsequent read or erase operation. During a read operation 49, the clock may be pulsed from a standby voltage to a high voltage and back again 57. This may preserve the state of the bits, while coupling their states onto their data lines. Given the bits may be set high, their internal nodes 15, shown in FIG. 1, may then be set at a voltage 25, shown in FIG. 2. The clock voltage pulse may cause the internal nodes 15, shown in FIG. 1, to rise and fall with the clock, which may cause a pulse 58 on the data line, coupled to the internal nodes. Given the bits may be set low, their internal nodes 15, shown in FIG. 1, may be set at voltage 24, shown in FIG. 2, and the clock voltage pulse 57 may cause little or no change in the internal nodes' voltages, which may create little or no pulse 59 on the coupled data line.

In another embodiment, a stencil may be fabricated, using a combination of vertical and V-groove etching, for repeated use in constructing memory cores without the use of masks.

Figure 7C:
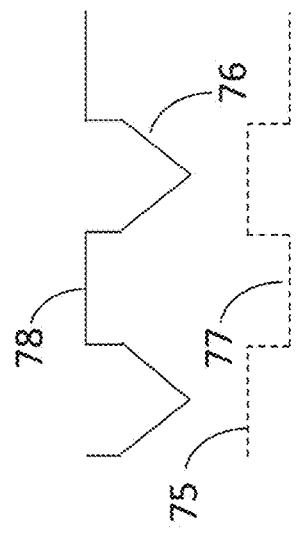
FIGS. 7A, 7B, 7C and 7D are X-direction cross-sections of a stencil during its fabrication, according to an embodiment of the invention.
Figure 7D:
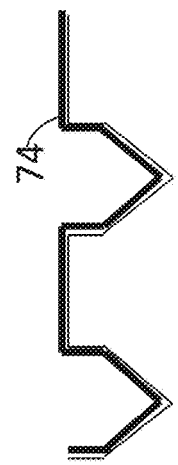
Figure 7A:
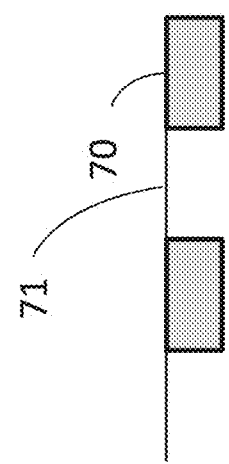

Reference is now made to FIGS. 6A, B and C, Y-direction cross-sections of a stencil during its fabrication, according to an embodiment of the invention. Initially a pattern of lines may be masked in the Y-direction, and a shallow vertical etch 62 may be performed on the exposed silicon wafer, as shown in FIG. 6A. The resulting shallow vertical trench may also be more clearly seen in an X-direction cross-section of the stencil, when subsequently filled with resist 70 and polished 71, as shown in FIG. 7A. Subsequently, a pattern of resist lines 60 in the X-direction may be masked onto the silicon wafer, and another vertical etch 61 may be performed as again seen in FIG. 6A. The resulting X-direction trenches may be deeper in the intersections 63 between the Y-direction etch 62 and the X-direction etch 61. Subsequently, as shown in FIG. 6B, V-grooves may be etched using the same resist pattern 60, used to create the X-direction deep trenches, creating deep V-grooves 65 in the intersections and shallower V-grooves 64 elsewhere. The resist may then be refilled into the V-groove trenches, 66 and polished off to expose the silicon 67, as shown in FIG. 6C. The resist may serve as an etch stop for the subsequent Y-direction etches.

Figure 7B:
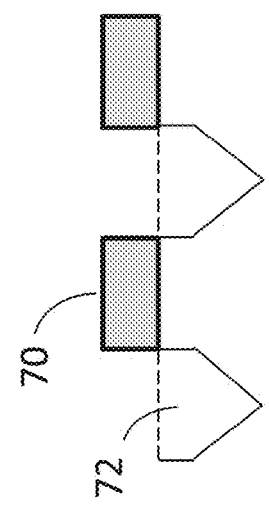

Reference is now made to FIGS. 7A, B, C and D, X cross-sections of a stencil during its fabrication. The resist 70 may also refill the Y-direction shallow trenches, and the polish may also expose the higher silicon 71, as shown in FIG. 7A. As with the X-direction V-groove trenches, the remaining resist may serve as an etch stop for a subsequent vertical and V-groove etches, creating another set of Y-direction V-grooves 72 with shallow vertical edges, as shown in FIG. 7B. The resist may then be removed, as shown in FIG. 7C, and a thin layer of non-adhesion material 74 may be applied to the stencil, as shown in FIG. 7D. Multiple applications may be required to completely cover the sides of the V-grooves. FIG. 7C also shows the bottom of the X-direction V-grooves 75, relative to the shallower Y-direction V-grooves 76, and the alignment of the deeper portion of the X-direction V-grooves 77, may be between the Y-direction V-grooves 78. It should be noted that the non-adhesion material may cover both the X- and Y-direction V-grooves, though only the Y-direction is shown in the FIG. 7D.

In another embodiment, a memory core having two perpendicular layers of electrically separate parallel conductive lines coupled to an array of internal nodes by diodes and capacitors, may be fabricated without masks by depositing, etching and polishing successive layers of material on a stencil.

Reference is now made to FIGS. 8A through F, Y-direction cross-sections of a memory core during fabrication on the stencil, according to an embodiment of the invention. Initially, as shown in FIG. 8A, a suitable conductive material, such as nickel, may be deposited onto the stencil to form the Y-direction data line segments 81, including the bottom of the X-direction V-grooves 82. Next, as shown in FIG. 8B, a thick oxide may be deposited 83. The oxide may have a high dielectric constant to enhance the capacitor coupling. In one embodiment, a short etch may be added to ensure that no oxide remains on the ends of the data line segments 81. The oxide and conductive layer materials may be chosen not to adhere to the non-adhesion layer, 74, on the stencil, as shown in FIG. 7D. A second layer of the same conductive material 84 may then be deposited, as shown in FIG. 8C. This second layer may be deposited so as to be thick enough to connect the Y-direction data line segments 81 across the X-direction V-grooves 85 into one long data line. This second layer of conductive material 84 may not entirely fill the Y-direction V-grooves 85. Then, a glass layer 86 shown in FIG. 8D, which may be thinner than both the deposited oxide 83 and the second layer of conductive material 84, may be deposited to cover the second layer of conductive material, leaving the ends of the second layer of conductive material exposed. Optionally, a short etch may be performed to ensure the ends of the second layer of conductive material are clean. An oxide may then be grown on the exposed ends 87 of the second layer of conductive material in the Y-direction V-grooves. A third conductive layer 88, as seen in FIG. 8E, may then be deposited, and subsequently polished off, down to the glass layer on top of the Y-direction V-grooves, leaving the third layer of conductive material in the deeper X-direction V-grooves 89 shown in FIG. 8F. Since all the layers of conductive material and oxides reside under the glass layer on top of the surface between the Y-direction V-grooves, an optional thin layer of initial glass may be deposited before the first conductive layer, to preserve the non-adhesion material on that surface during the polish down to the corresponding glass on the tops of the Y-direction V-grooves. Finally, a flexible insulating polymer 89, shown in FIG. 8F, may be deposited to form a backing prior to peeling the memory off the stencil.

Figure 11:
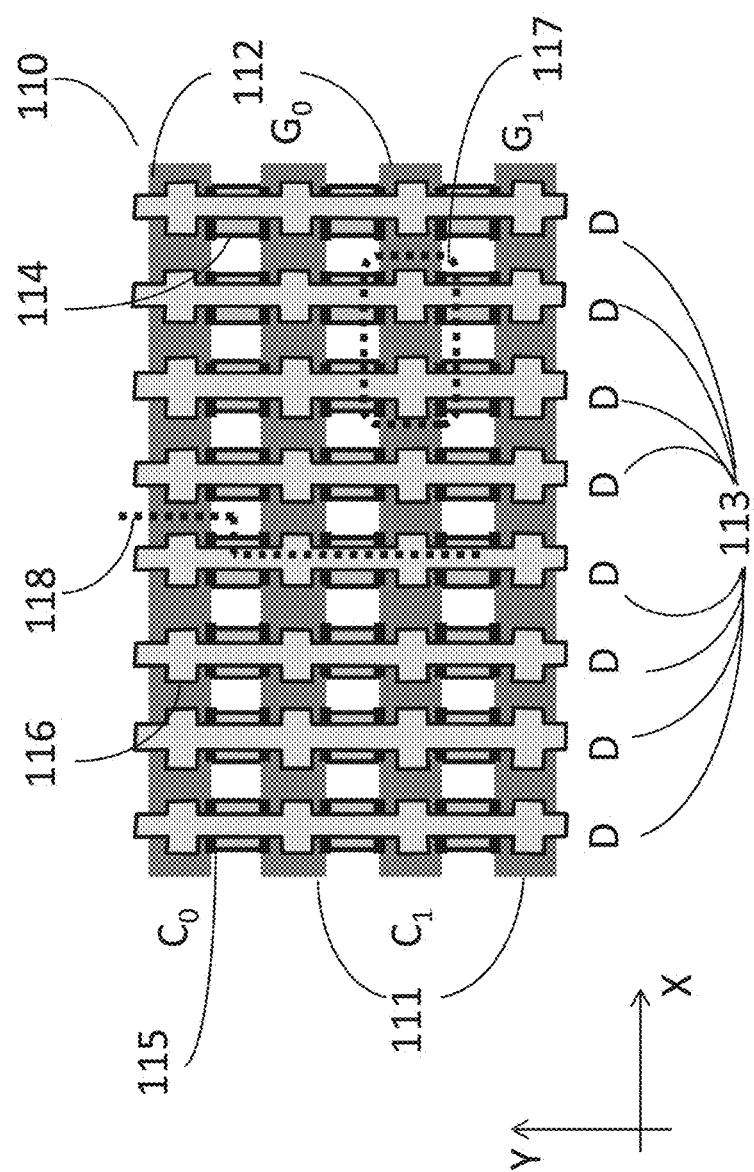
FIG. 11 is a top view of a portion of memory core following fabrication, according to an embodiment of the invention.

Reference is now made to FIGS. 9A, B and C, two adjacent connected Y-direction cross-sections of a memory array, peeled from the stencil and flipped over, corresponding to the cut line 118 shown in FIG. 11. A cover glass layer 90, may be added on the top of the memory array, as shown in FIG. 9A. The deeper parts of the X-direction V-groove trenches 91 may contain a thicker third conductive layer, such that the glass layer 92 may align with the top of the first layer of conductive material 93. Optionally, this thick cover glass may be polished to remove the unnecessary layers 94 down to the first layer of conductive material 93 and the second layer of conductive material in the X-direction V-grooves 96, which may together form the data lines in the Y-direction, as shown in FIG. 9B. Optionally, an annealing step may be performed to reduce or eliminate any boundary between these sections of the data lines. Then, an additional passive material 95 may be added to cover the exposed conductive materials, as shown in FIG. 9C. It should be noted that other fabrication steps may be added, or the steps described herein may be modified in ways that may be used to improve the yield of the memory cores or for preservation of the stencils.

Reference is now made to FIG. 11, a top view of a portion of a memory core 110, with a cut line 118 corresponding to the adjacent connected cross-sections shown in FIGS. 9A, B and C. The bottom layers may have ground lines 111 and clock lines 112, with a thin grown oxide layer 115 between the ground and clock lines and the internal nodes 114 that together may form the pair of tunnel diodes. The data lines 113 may be coupled to the intermediate nodes 114 through capacitors. The data lines may be separated by the glass layer in the deeper parts of the V-groove trenches in the X-direction, but may extend beyond the narrow lines formed in the bottom of the Y-direction V-grooves, which may cause bulges 116. Y- and X-direction cross-sections of a portion 117 of the memory core are shown in FIG. 12.

Figure 12:
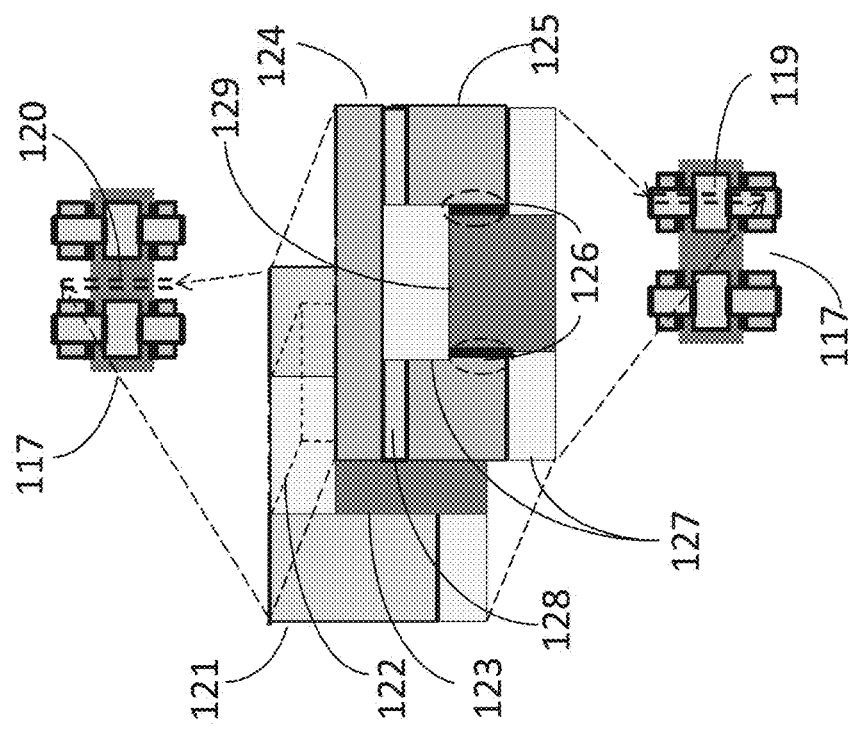
FIG. 12 shows multiple Y-direction cross-sections of a portion of a memory core, according to an embodiment of the invention.

Reference is now made to FIG. 12, two Y-direction cross-sections 119 and 120 of a portion of a memory core 117. The internal node 125 may be coupled to the clock conducting material 129 by a vertical layer of thin oxide 126 grown on the internal node's conducting material. The glass layer 127 may be thicker than the polished data line 124 to ensure insulation between data lines, and may be thinner than the combination of the deposited oxide 127 and the second layer of conductive material that forms the internal node 125 to ensure grown oxide 126 exists to form the tunnel diodes. The cover glass layer 121 may separate the clock and ground conductive material 123 formed by the deeper portions 122 of the Y-direction V-grooves.

Figure 22:
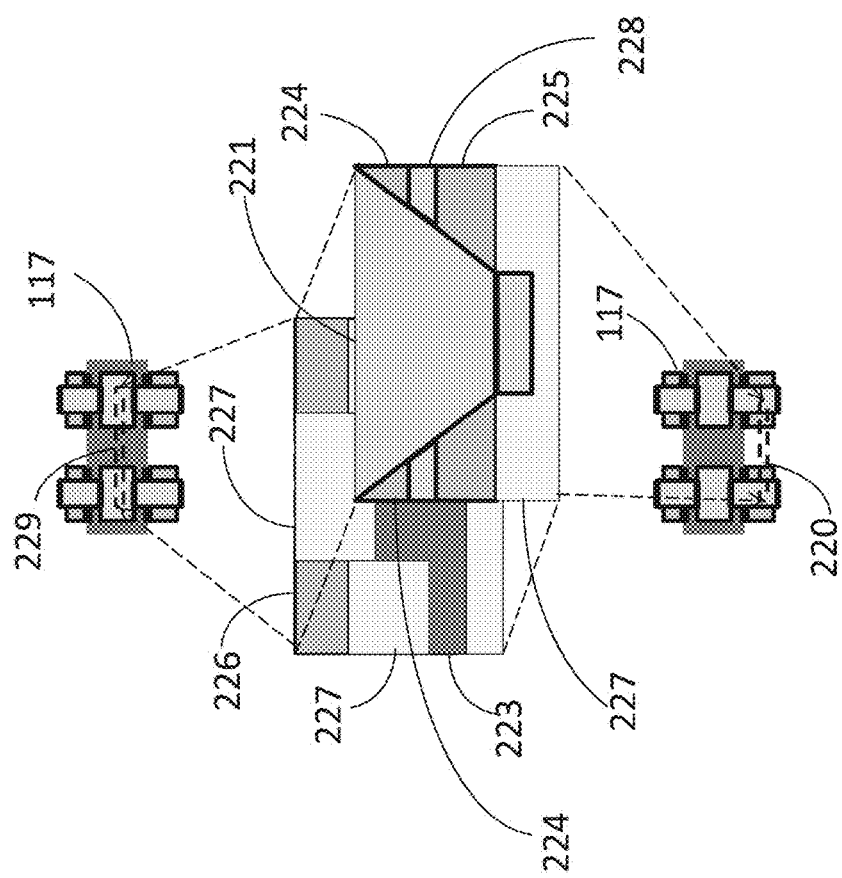
FIG. 22 is another pair of X-direction cross sections of a portion of a memory, according to an embodiment of the invention.

Reference is now made to FIG. 22, two X-direction cross sections 229 and 220 of a portion of a memory core 117. Cover glass 221 may extend into the glass layer 227 to separate the adjacent portions of the Y-direction data lines 224 and the internal nodes 226. The data lines 224 may be formed from the first conductive material, and the internal nodes 226 may be formed from the second conductive material, both of which may be separated by the deposited oxide 228 that may form capacitors between them. The glass layer 227 may separate the portions of the data lines 226, which may be formed from the second conductive material. The glass layer 227 may also separate the data lines 226 from the clock and ground lines 223, which may be formed from the third conductive material. In this manner, two perpendicular layers of electrically separate conductive lines may be coupled to an array of internal nodes by diodes and capacitors, and may be fabricated without masks by depositing, etching and polishing successive layers of material on a stencil.

In another embodiment, I/O pads may be created for the clock, ground and data lines using a similar process of depositing, etching and polishing successive layers of material on a stencil as was used to create the memory core. The I/O pads may be constructed using the stencil, such that after removing the memory from the stencil, the steps of polishing, applying a protective layer and adding solder bumps to the I/O pads may be performed to prepare the memory to be attached to other electronics.

Figure 10A:
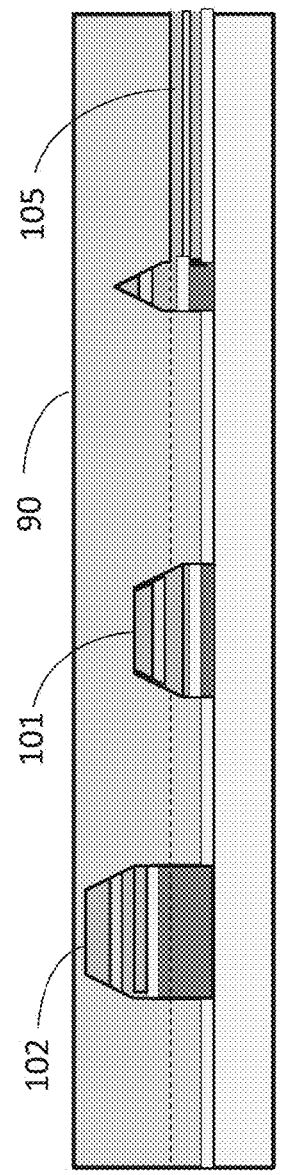
FIGS. 10A, 10B and 10C are cross-sections of the memory pads during its fabrication after removal from the stencil, according to an embodiment of the invention.
Figure 10B:
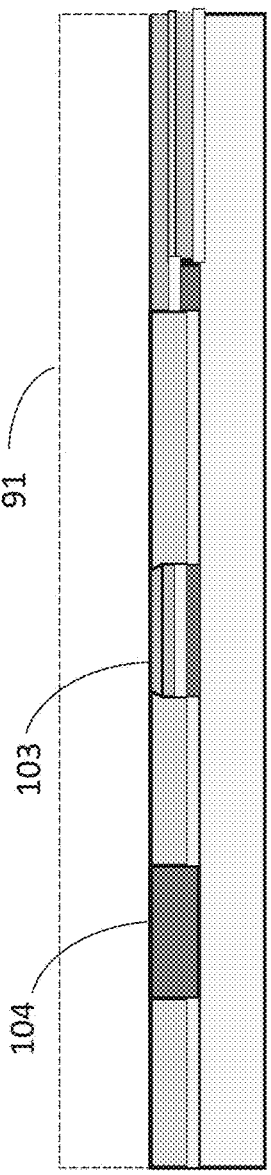
Figure 10C:
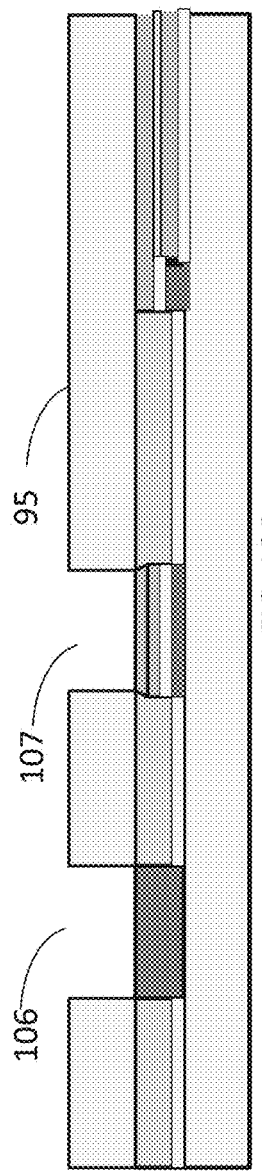

Reference is now made to FIGS. 10a, 10b and 10c, cross-sections of the memory core pads during fabrication, after removal from the stencil, according to an embodiment of the invention. The stencil for the ground and clock pads may be deep enough to create a thick third conductive layer 102, and the stencil for the data line pads may be shallower to align the second layer of conductive material in the pad 101 to the internal data line layer 103, prior to polishing off the cover glass layer 90, as seen in FIG. 10A. Polishing off the cover glass 91, exposes the third layer of conductive material in the clock and ground pads 104 and the second layer of conductive material in the data line pads 103, as seen in FIG. 10B. Optionally, a passive material 95 may be deposited, a pad mask may be may be used on resist to etch away the passive material above the clock and ground pads 106 and the data line pads 107, as can be seen in FIG. 10C. Thereafter bonding wires or solder bumps may be applied to the pads.

Figure 13:
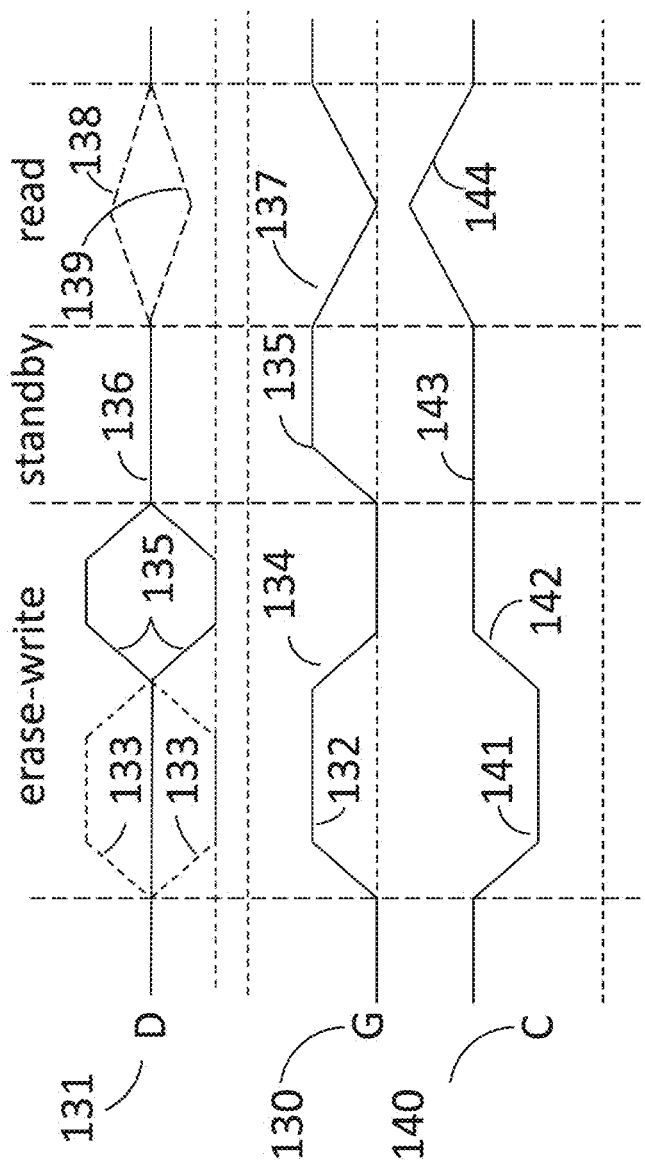
FIG. 13 is another timing diagram of the clock, ground and data signals that may be applied to a tunnel diode memory.

In another embodiment, both the clock and the ground lines may be used to independently program each row of bits in the memory. Reference is now made to FIG. 13, another timing diagram of the clock, ground and data signals applied to a tunnel diode memory. As can be seen on the timing diagram, for all operations, the voltage on the clock line 140 for the selected row of bits may move from mid voltage to above high voltage, and the voltage on the ground line 130 for the selected row of bits may move from low voltage to mid voltage. The erase-write operation may be performed on one row of bits by initially raising the voltage of the selected ground line 130 to a mid voltage 132, and initially lowering the voltage of the selected clock line 130 to the same mid voltage 141, to erase the selected row of bits. During the operation, all other clock line voltages may be maintained at a high voltage, and all other ground line voltages may be maintained at a low voltage, though only a ground line adjacent to the selected clock line may be lowered to a low voltage to avoid erasing the adjacent row of bits. Then, to write the new data, the selected ground line 130 may be lowered to a low voltage 134, and the selected clock line 140 may be raised to a high voltage 142 while transitions 135 occur on the data lines 131. The transitions 135 on the data lines 131 may determine the written states of the selected bits. All other rows of bits may maintain their states, assuming that they maintain their respective clock line to ground line voltage differences. Between other operations, the standby operation may raise the ground line 130 to a mid voltage 135 and keep the clock line 140 at a high voltage 143, which may reduce power. To read a bit, the clock line 140 voltage may be raised to a higher voltage 144 while the ground line 130 voltage is lowered to a low voltage 137. The capacitor coupled between the data line and the internal node may pull the data line up 138, if the internal node is held at a high voltage, and down 139, if the internal node is held at a low voltage. The state of the adjacent memory bits may reduce but not eliminate the response on the data line 131. In this manner, each bit of the memory may be independently written and read, one row of bits at a time.

Figure 14:
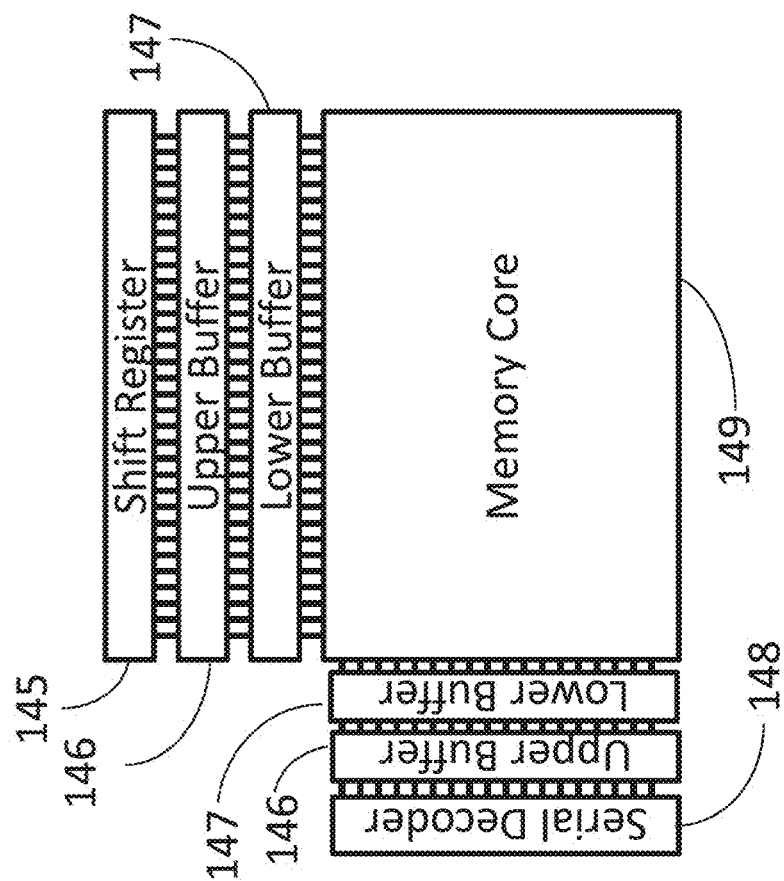
FIG. 14 is high-level diagram of the memory with control logic, according to an embodiment of the invention.

In another embodiment, to minimize the number of pads required for the memory core, the control logic may be constructed around the core. Such logic may be formed, e.g., out of graphene metal oxide transistors, which may, in one of several non-limiting alternatives, be constructed using nickel, nickel oxide, and graphene. Alternatively, tunnel diode control logic may be constructed using similar structures and spacing as may be used to form the memory core. Reference is now made to FIG. 14, a high-level diagram of an example of memory with control logic. A set of data line control logic, above the memory, may include a shift register 145, an upper buffer 146 and a lower buffer 147. The shift register 145 may be used to shift in the data line transitions and load them into upper buffers 146, which may then be loaded into lower buffers 147, which in turn may drive the data lines within the memory core 149. The buffers and shift registers on the data lines may also be used to capture and shift the resulting data out. A set of address control logic on the side of the memory may control the clock and ground lines within the memory core 149. This set of control logic may include a serial decoder 158, an upper buffer 146 and a lower buffer 147. The serial decoder 158 may be used to select two rows of memory from an inputted address. The lower buffer may be loaded to select between the two rows. This example of the data control logic may use pads for one external data input, one external data output, six external clock signals and two external ground signals. The clock and ground control logic may use pads for two polarities of external address signals, seven external clock signals and seven external ground signals. Combined this may total 26 external signals. The pair of buffers may allow single-direction transitions by successively loading opposite polarity signals onto the data lines of the memory core. The two buffers plus the serial decoder may allow pulses by successively loading the opposite polarity signal followed by the original signal onto the clock and/or ground lines.

Figure 15:
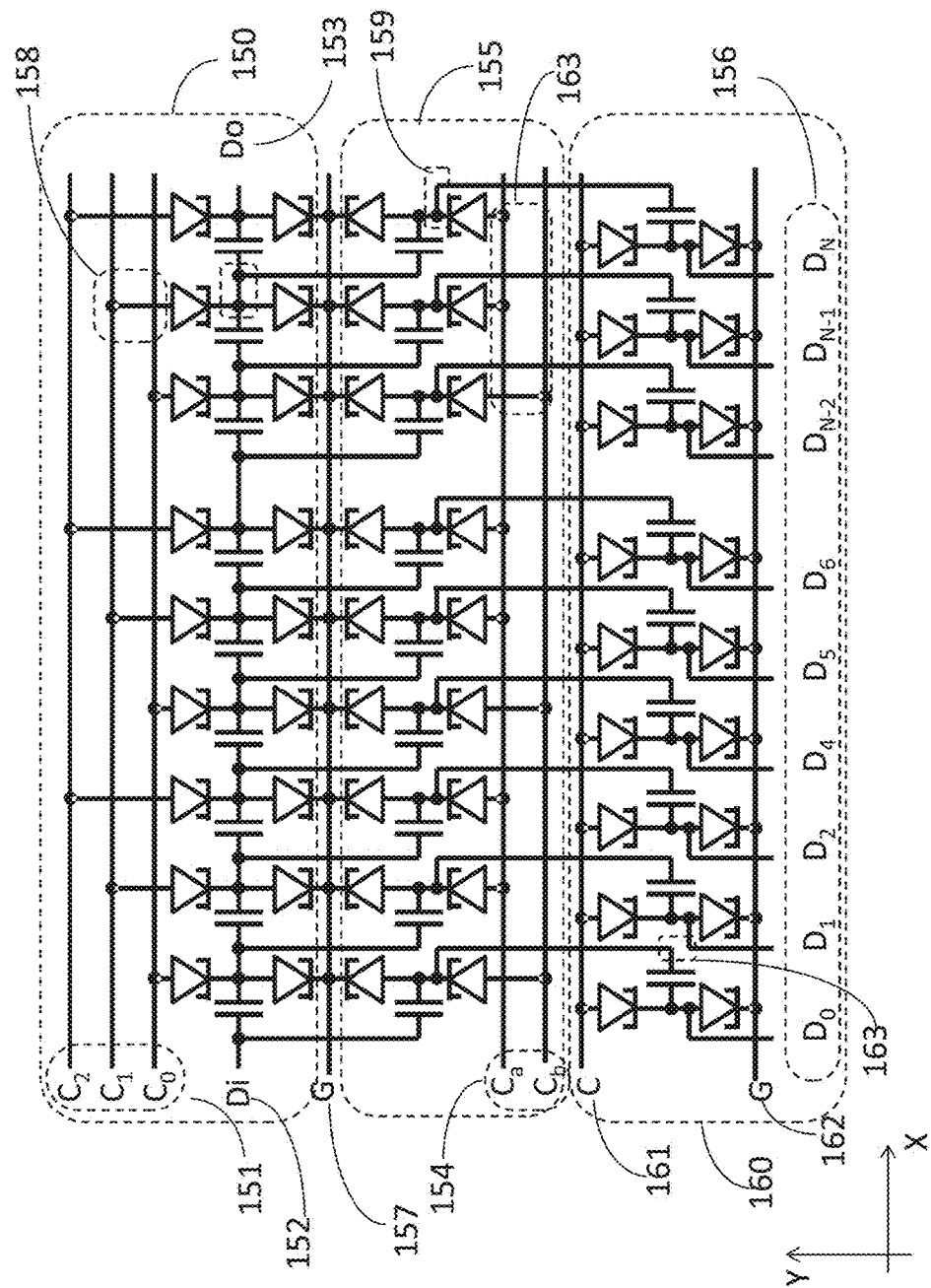
FIG. 15 is a detailed diagram of a portion of data control logic, according to an embodiment of the invention.

Reference is now made to FIG. 15, a detailed diagram of a portion of an example of data control logic having a shift register 150 with three clocks 151, a data in line 152 and a data out line 153, an upper buffer 155 with two clocks 154, coupled to the shift register 150 and a lower buffer 160. The diagram shows a common ground line 157 for both the upper buffer 155 and the shift register 150. The lower buffer 160 may have its own clock 161 line, ground 162 line and connections to the memory core's data lines 156. The bits of the shift register 150 and buffers 155, 160 may be physically aligned with the memory core's data lines.

Figure 16:
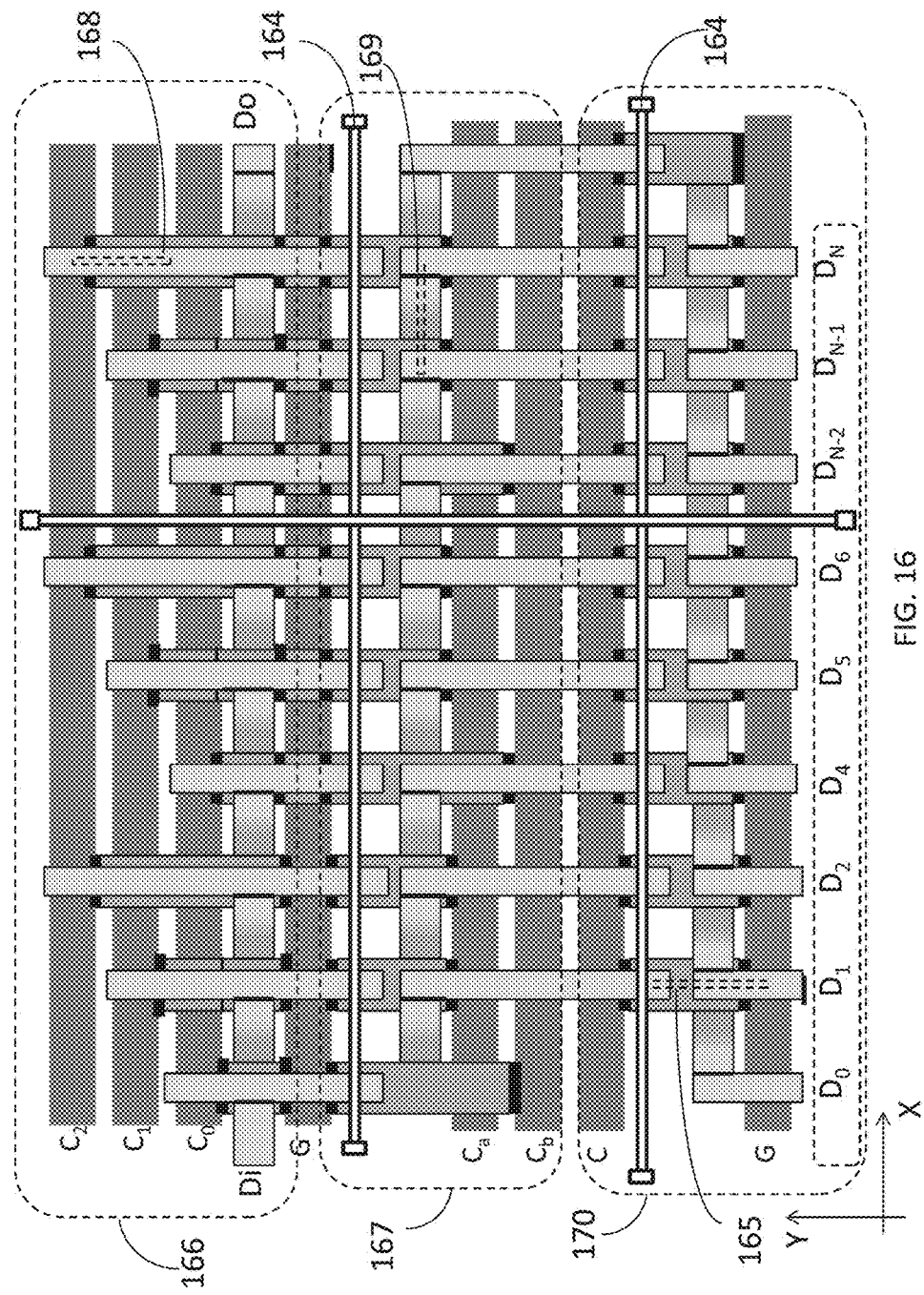
FIG. 16 is a top view of the control logic shown in FIG. 15.

Reference is now made to FIG. 16, a top view of the control logic shown in FIG. 15, showing a corresponding shift register 166, upper buffer 167, and lower buffer 170. A cut line 169 may form a transition connecting the first layer of conductive material to the second layer of conductive material corresponding to the connection 159 shown in FIG. 15, connecting the internal node to the data line capacitor. A cut line 168 may form a transition over the third conductive layer without diode connections corresponding to the clock line to diode connection 158 shown in FIG. 15. A cut line 165 may form breaks in the first conductive layer corresponding to the break in the data line 163 shown in FIG. 15. The diagram breaks 164 indicate that the capacitors on the buffers may not be to scale. Furthermore, the actual structures corresponding to the features in FIG. 16 may be wider or narrower than shown in the diagram.

Figure 17B:
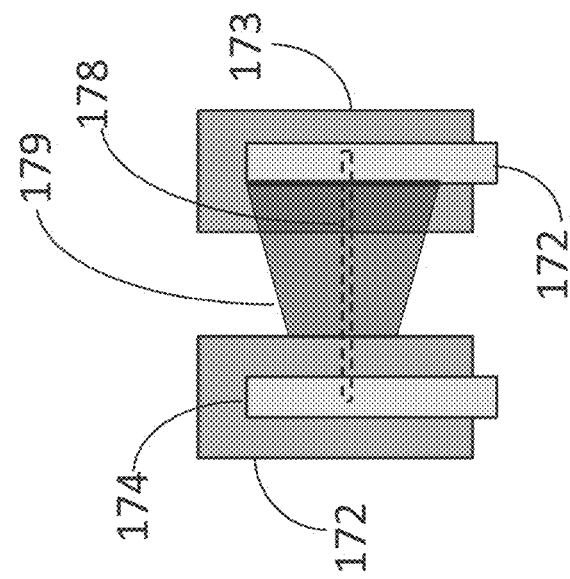
FIG. 17B is a top view of the cross-section in FIG. 17A.
Figure 17A:
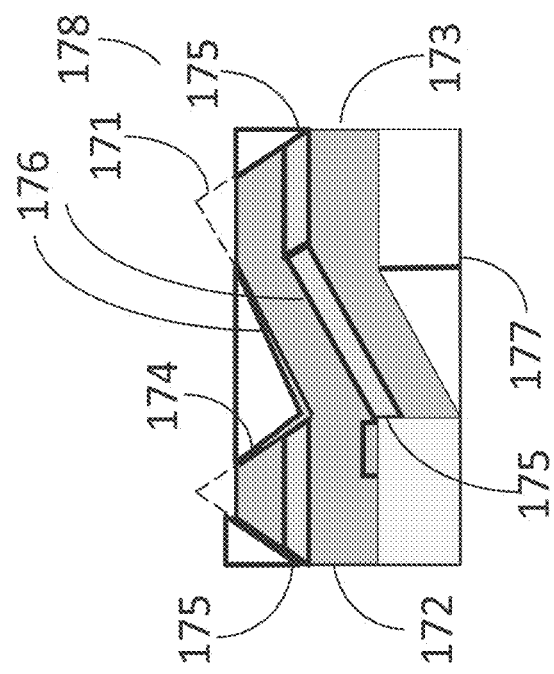
FIG. 17A is an X-direction cross-section diagram of a portion of the control logic, according to an embodiment of the invention.

Reference is now made to FIG. 17A, a cross-section diagram of a portion of the X-direction control logic, corresponding to the cut line 169, shown in FIG. 16, and the cut line 178 in FIG. 17B. The cross-section depicts a transition from the first conductive layer to the second conductive layer 172. The deposited oxide 175 separates the first conductive layer 174 from the transition 172 and the second conductive layer 173. The top of the first conductive layer 174 may be polished off 171. The transition 172 may be formed by a sloped structure 176 connecting the first conductive material to the second conductive material, thereby connecting a data line to the internal node of an adjacent device. Given the proper thickness, the cover glass 177 may fill the available space below the second conductive layer.

Reference is now made to FIG. 17B, a top view of the cross-section in FIG. 17A. The slope may be constructed by V-groove etching a triangular structure 179 between two V-grooves on the stencil.

Figure 18B:
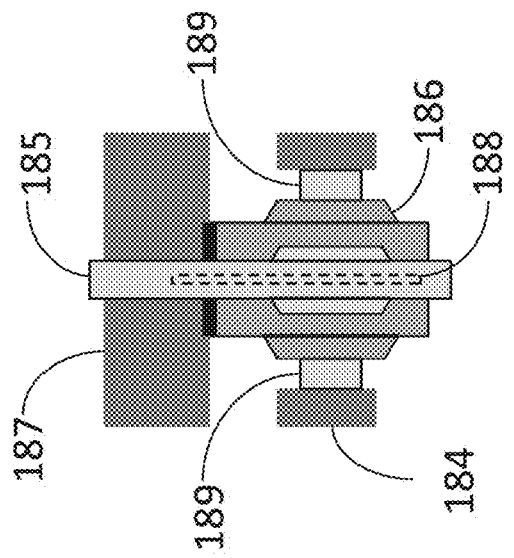
FIG. 18B is a top view of the cross-section in FIG. 18A.
Figure 18A:
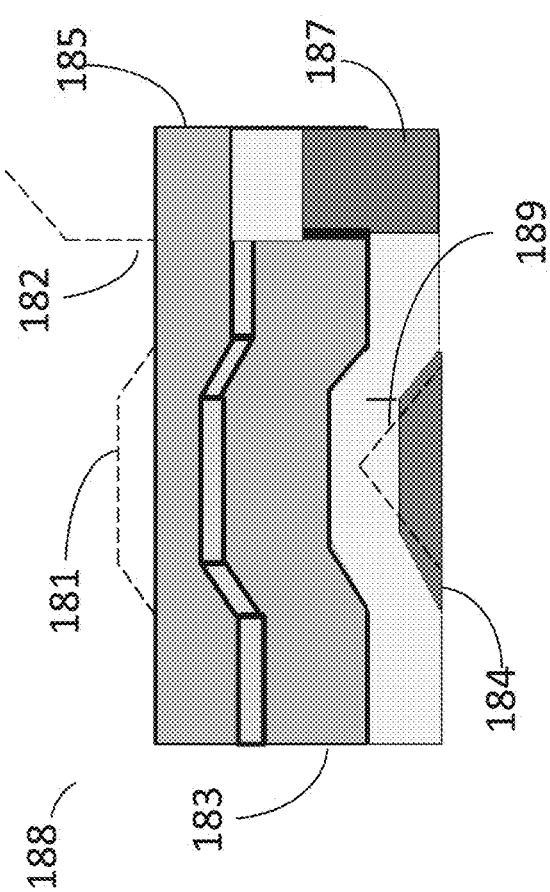
FIG. 18A is a Y-direction cross-section diagram of a portion of the control logic, according to an embodiment of the invention.

Reference is now made to FIG. 18A, a Y-direction cross-section diagram of a portion of the control logic, corresponding to the cut line 168 in FIG. 16, and 188 in FIG. 18B. A section of deeper Y-direction V-groove 181, which may be shallower than the X-direction V-grooves 182, may be filled with the conductive materials, oxide and glass layers, removed from the stencil and polished off, keeping some of the third conductive layer 184 to connect under the second conductive layer 183, without completely removing the first conductive layer 185. A shallow X-direction V-groove 189 may connect the third layer of conductive material together with a first layer of conductive material.

Reference is now made to FIG. 18B, a top view of the cross-section in FIG. 18A. The sloping deeper section may be created by connecting the widening Y-direction V-groove 186 to a shallow section 189 of the deep X-direction V-groove 184. This shallow section 189 may be shallow enough to allow the cover glass (not shown) to insulate the first and second conductive layers from the rest of the X-direction V-groove 184.

Figure 19B:
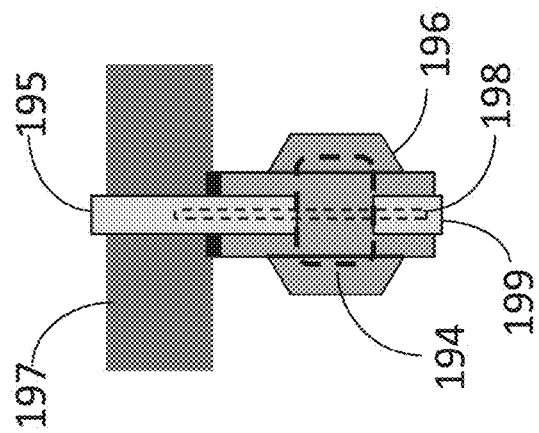
FIG. 19B is a top view of the cross-section in FIG. 19A.
Figure 19A:
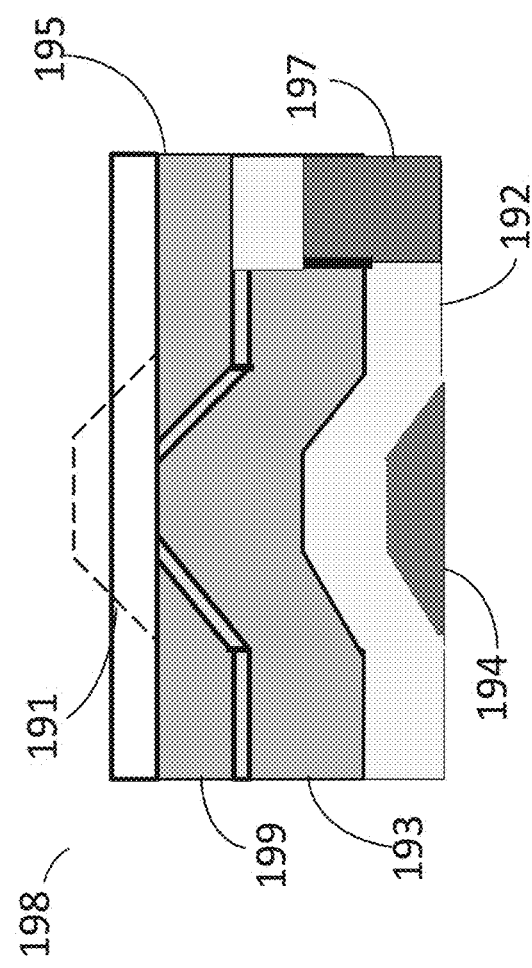
FIG. 19A is another Y-direction cross-section diagram of a portion of the control logic, according to an embodiment of the invention.

Reference is now made to FIG. 19A, another cross-section diagram of a portion of the Y-direction control logic, corresponding to the cut line 165, shown in FIG. 16, and 198 in FIG. 19B. The stencil for the structure 191 may be constructed to be deeper than the structure 181 shown in FIG. 18A, which may enable a portion of the data line to be polished off, which may separate one part of the data line 199 from the other 195, while keeping the underlying internal node 193 connected. The structure, though deeper than the structure 181 shown in FIG. 18A, may also be shallower than the X-direction V-grooves, such that the third layer of conductive material 194, which remains below the glass layer 192, may be thinner than the conductive material 197 in the X-direction V-groove.

Reference is now made to FIG. 19B, a top view of the cross-section in FIG. 19A. A bulge 196 in the Y-direction V-groove may be larger than the corresponding structure in FIG. 18B, which may allow the stencil for the structure 191 to be deeper than the corresponding structure 181 in FIG. 18A. The cover glass (not shown) may cut off the third layer of conductive material 194 between Y-direction V-grooves, leaving it unconnected below the internal node.

Applying the above techniques to the alternating deposition of conducting and insulating materials onto a combination of flat and gradually sloping V-grooves of different depths may preserve the order of deposition. Applying the same alternating deposition of conducting and insulating materials onto V-grooves intersecting into vertical walls of other V-grooves may connect one conductive layer to another. Combining the deposition onto these structures may allow for three electrically independent conductive layers, which may be selectively connected, to reside vertically electrically separate in the same two-dimensional location, without the use of masks.

Figures 20, 21:
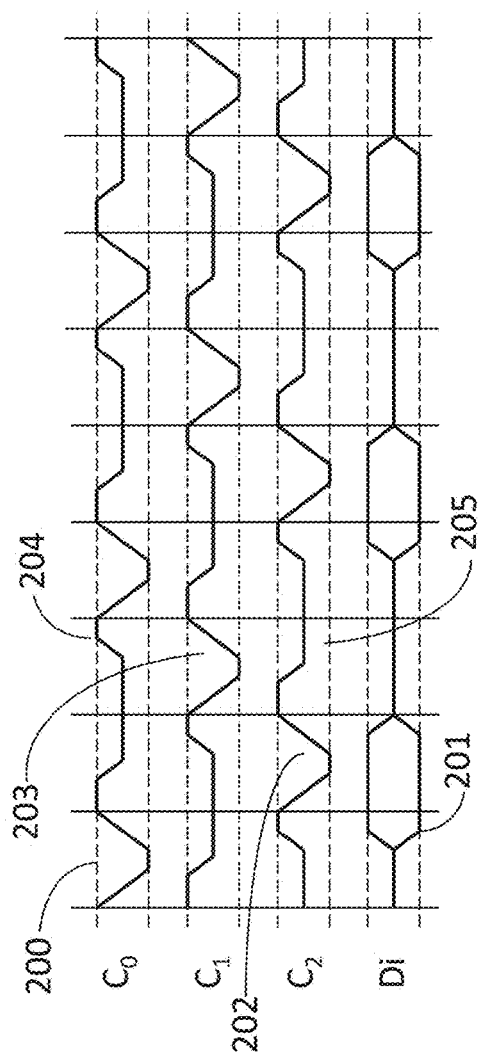
FIG. 20 is a timing diagram for a tunnel diode shift register according to an embodiment of the invention.
FIG. 21 is a diagram of shifted and captured data, that may be obtained in various embodiments of the invention.

Reference is now made to FIG. 20, a timing diagram for a tunnel diode shift register. The ground line is not shown; it may remain at a low voltage. The first bit in the shift register, which may be coupled by a capacitor to the data in line 152 shown in FIG. 15, may be clocked by the $C_0$ clock. In the first clock cycle 200, the $C_0$ clock's voltage may drop to a low value to erase the bit, which may be followed by increasing the voltage to a high voltage while the data in line may transition high or low 201 to write the first bit. The third bit may be written in the next cycle 202 to preserve the second bit's value, which may be followed by writing the first bit's value into the second bit 203. On each successive cycle, the previous bit's clock may rise from a mid voltage to a high voltage 204, and the next bit's clock may remain stable 205, as the current bit 203 may be written. This may ensure the bit values may correctly shift from the data in to the data out lines.

Reference is now made to FIG. 21, a diagram of shifted and captured data. Upon completion of shifting data into the shift register, every third bit, denoted by a blank location, may be a duplicate of the data after it, as shown in the four passes 211, 212, 213 and 214. In order to input unique data into each bit of the upper buffer, it may be necessary to shift ⅔ of the intended data into the shift register, write ⅔ of the shift register bits into the upper buffer as shown in the $1^{st}$ pass 201 and $3^{rd}$ pass 213. Then, it may be necessary to shift the last ⅓ of the data interleaved with a repeated ⅓ of the data into the shift register, ending on a different shift clock, to align the duplicate entry in a location that has already been written, and to write the last ⅓ of the shift register bits into the unwritten ⅓ of the upper buffer's bits, as shown in the $2^{nd}$ pass 212 and $4^{th}$ pass 214. The clock connections 163 in FIG. 15 may be prewired to clock $C_a$ for the $1^{st}$ and $3^{rd}$ passes, and clock $C_b$ for the $2^{nd}$ and $4^{th}$ passes. After the first two passes, the upper buffer may contain all the negative polarity data 210. The upper buffer 215 may then be written into the lower buffer 216. Using the same technique, the positive data may be loaded into the upper buffer 215. At this point the memory core's data lines may be set with the negative polarity data. Thereafter voltage transitions on the memory core's data lines may be performed by writing the upper buffer data into the lower buffer.

To read the memory core's data, the lower buffer may be written while a row of data is being read, transferring the lower buffer contents to the upper buffer while keeping the shift register off. Then, twice, the contents of the shift register may be written from the upper buffer, one shift clock at a time and shifted out, each time using a different initial shift clock to provide a different set of data each time. The resulting data may then be interleaved, removing ⅓ of the duplicate data.

In another embodiment, when performing a read, the combination of initial shift clocks may vary to obtain different duplicate data, and the duplicate data may be checked to continuously verify the proper operation of the memory.

In yet another embodiment, each line of data may be encoded such that any ⅔ of the line oft data may be sufficient to reconstruct the entire line of data. All reads may then be performed in a single pass of the shift register.

In another embodiment, an address may be serially inputted into control logic having a tunnel diode serial decoder coupled to an upper buffer, which in turn may be coupled to a lower buffer such that the clock and ground lines connected to each row of the memory core may be pulsed to read, write or erase the row of data.

Figure 23:
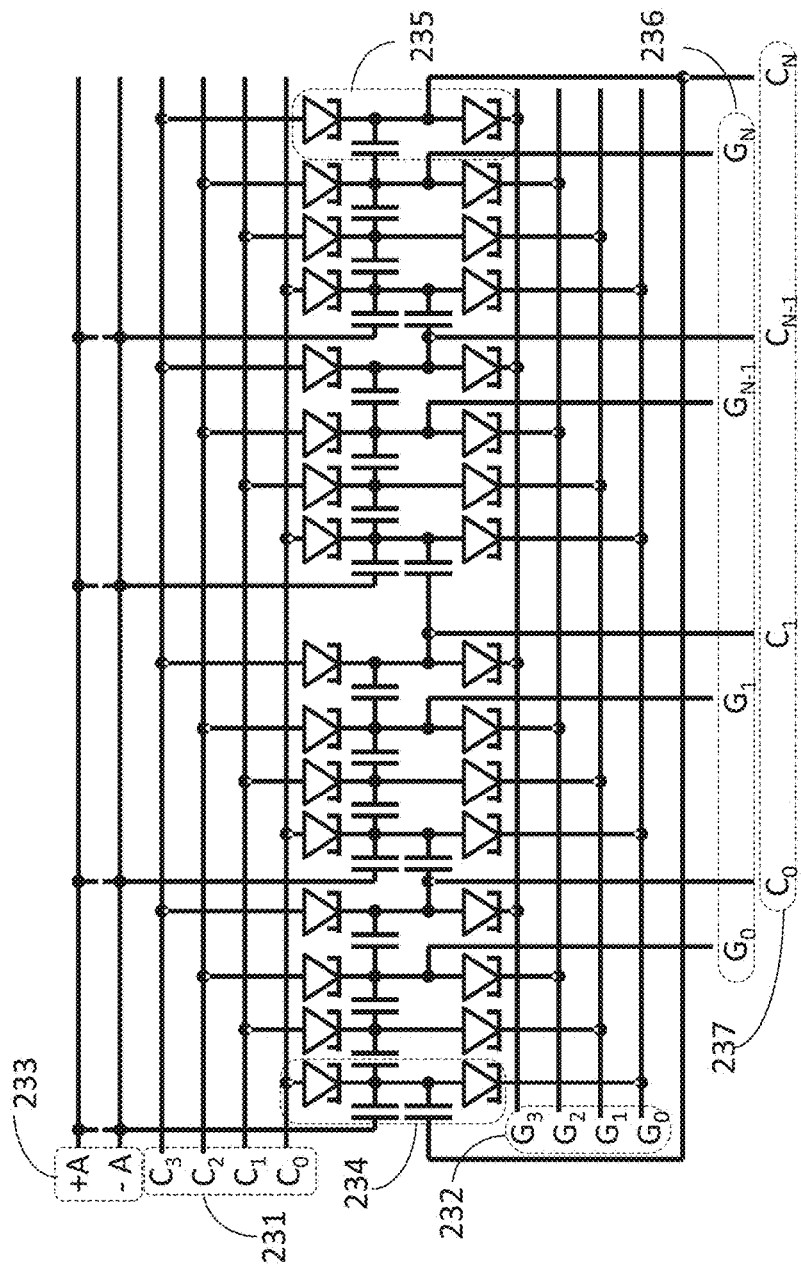
FIG. 23 is a detailed diagram of serial decode logic, according to an embodiment of the invention.

Reference is now made to FIG. 23, a detailed diagram of an example of serial decode logic. There may be four external clock signals 231 and four external ground signals 232, such that each set of four successive bits in the circular shift register may be controlled by a unique pair of external clock and ground signals. The first bit 234 out of each set may be controlled by a logical function of the state of the previous bit (the fourth bit 235 of the previous set) and either the positive or negative address lines 233, which may be done according to a pattern defined by the inventor in U.S. Pat. No. 7,421,563, granted Sep. 2, 2008, and incorporated herein by reference. Given $2^M$ rows of bits in the memory core, after M−1 transitions on the address lines, the first bit of the set corresponding to the serially inputted address, may be the only bit with a polarity opposite all the other first bits. Erasing while writing may invert the transferred bit values on each shift. In this manner, when written, the third bit of each set may have the opposite state to the fourth bit of each set. The third bit in each set 236 may be coupled through the upper and lower buffers to the ground lines in the memory core. The fourth bit 237 in each set may be coupled through the upper and lower buffers to the clock lines in the memory core.

Figure 24:
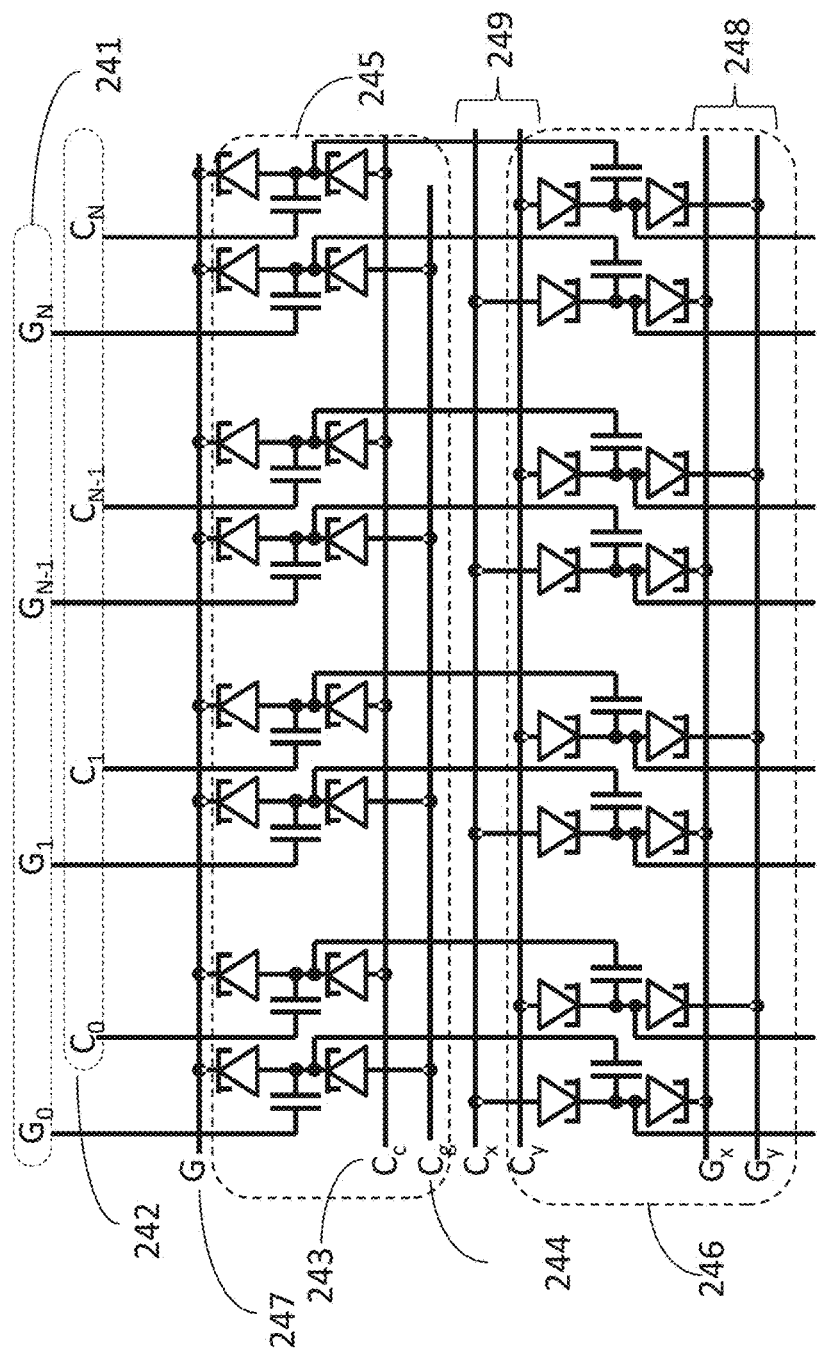
FIG. 24 is a diagram of the upper and lower buffer coupled to the serial decode logic, according to an embodiment of the invention.

Reference is now made to FIG. 24. The upper buffer bits corresponding to the ground lines 241 may be connected to a $C_g$ external clock signal 244, while the upper buffer bits corresponding to the clock lines 242 may be connected to the $C_c$ external clock signal 243. To align with the serial decoder, only two of every four bit positions in both the upper buffer 245 and lower buffer 246 may be implemented in the address control logic. To initialize the serial decoder, all clock and ground lines may be set to first erase all the bits and then write a value determined by an up or down transition applied to both address lines. The serial decoder may have N sets of bits where $N=2^{M-1}$ because each clock line or ground line addresses two rows. As such the M−1 bit portion of the M bit address may select a clock line $C_k$, and the last bit of the address may be used to select between $G_k$ or $G_{k+1}$, thereby selecting between the two rows controlled by clock line $C_k$.

Figure 25:
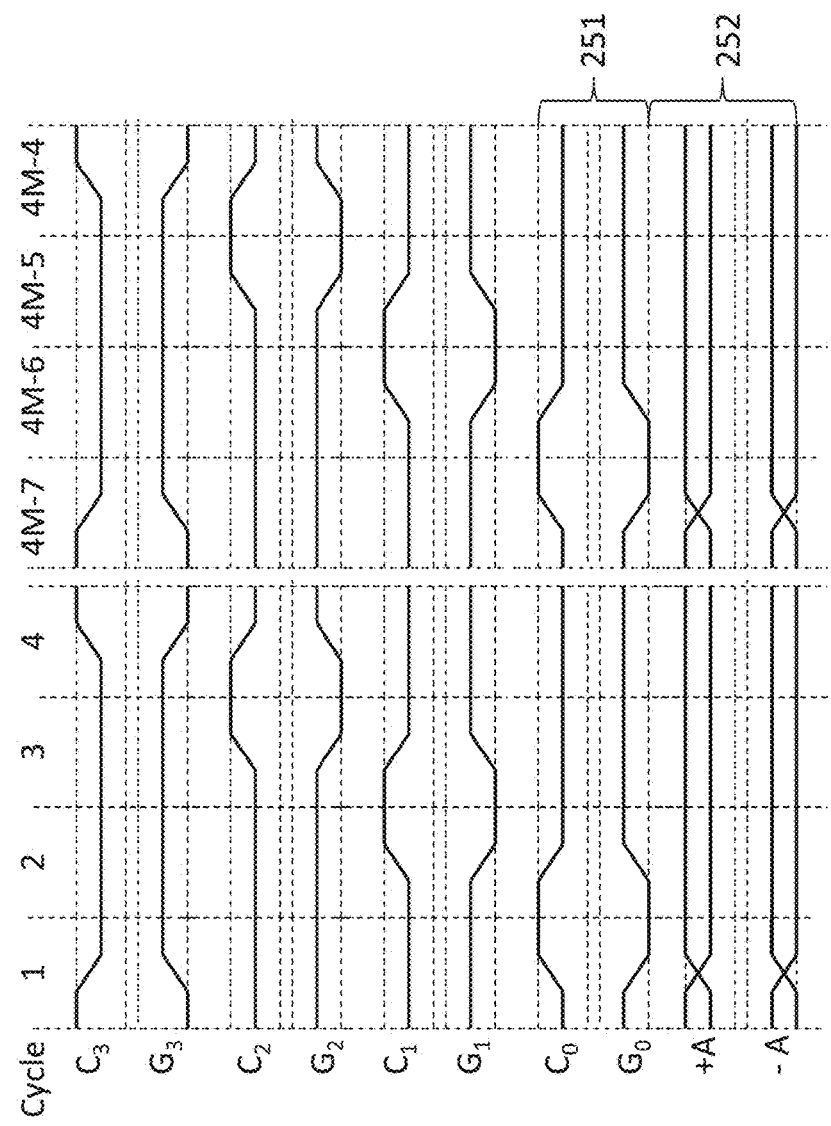
FIG. 25 is a timing diagram for the serial decode logic, according to an embodiment of the invention.

Reference is now made to FIG. 25, a timing diagram for the serial decode logic. Starting with the first bit 251, each of the four bits may repeat four cycles comprising: one cycle to write, a cycle to erase and two off cycles, where each successive bit is delayed one cycle from the previous bit, thereby aligning the transitions, which may occur during the erase cycle of each bit, with the write cycle of the successive bit, so that the opposite state may be written into each successive bit, on each successive cycle. In this manner, the serial decoder may successively shift its states from one bit to the next. The external address lines may be transitioned 252 in opposite directions simultaneous when writing the first bits they are coupled to, until one bit may have the opposite polarity to all the other bits. For an M-bit address, this may occur after 4*M−7 cycles. To select the ground line, if the last address bit is a zero, on the 4*M−4$^{th}$ cycle, the contents of the serial decoder may be simultaneously written into both the upper buffer with the external clock $C_b$, and the fourth bit of each set in the serial decoder. To select the clock line, on the next cycle, the 4*M−3$^{rd}$ cycle, the contents of the serial decoder may be simultaneously written into both the upper buffer with the external clock $C_c$ and the first bit of each set in the serial decoder. Finally, if the last bit of the address is one, to select the ground line, the contents of the serial decoder after the 4*M−1$^{st}$ cycle may be written into the upper buffer with the external clock $C_g$. To issue the pulses, the serial decoder may be initialized to one state and $C_g$ may be clocked while transferring the third bit to the fourth, to set the ground line bits in the upper buffer, and thereafter $C_c$ may be clocked while erasing the fourth bit to set the clock line bits in the upper buffer. The upper buffer may then be written into the lower buffer. Next, the serial decoder may be clocked as many cycles as needed to write the selected clock and ground line transitions into the upper buffer, and the serial decoder may again be initialized. The upper buffer may then be written into the lower buffer, followed in quick succession by the serial decoder being clocked and written into the upper and then lower buffer again.

Reference is again made to FIG. 24, a diagram of the upper and lower buffer coupled to the serial decode logic. It is also further contemplated that the lower buffer 246 connected to the clock and ground lines for the memory core may have different external clock signals 249 and external ground signals 248 such that they may simultaneously transition to and from different voltages. It is also further contemplated that the external ground and clock signals for the clock lines may transition to higher voltages in order to transition the selected clock lines from a high voltage to a higher voltage during a read. Finally, it is also contemplated that an additional middle buffer may be added to the address control logic to speed the operation of the pulses.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

What is claimed is:

1. A memory core comprising:
a first layer of parallel conducting lines;
a second layer of parallel conducting lines, perpendicular to the first layer of parallel conducting lines; and
an array of conducting segments;
wherein each of said conducting segments is coupled to one line of said first layer of parallel conducting lines through a capacitor,
wherein each of said conducting segments is coupled to each of two adjacent lines of said second layer of parallel conducting lines through tunnel diodes, and
wherein each conducting segment and two tunnel diodes form a bit of memory read and written through the capacitor coupled to the conducting segment.

2. An integrated memory comprising:
control logic; and
a two-dimensional array of memory bits;
wherein the integrated memory is designed using only tunnel diodes and capacitors connected using at least two layers of conductive material;
wherein the control logic includes:
a serial decoder;
a shift register; and
buffers coupled to the serial decoder and shift register;
wherein the serial decoder is configured to decode a serially inputted address, and
wherein the shift register is configured to serially shift a line of data into or out of the integrated memory.

3. An integrated memory comprising:
control logic; and
a two-dimensional array of memory bits;
wherein the integrated memory is designed using only tunnel diodes and capacitors connected using at least two layers of conductive material, and wherein the two-dimensional array of memory bits comprises rows of memory bits and pairs of parallel clock and ground conductive lines, and wherein each respective pair of parallel clock and ground conductive lines is used to read and write a respective row of memory bits.

4. The integrated memory as in claim 3, further comprising external connections,
wherein a number of external connections is independent of how many rows and columns of memory bits are contained in the two-dimensional array of memory bits.

5. The integrated memory as in claim 4, wherein the array of memory bits is entirely controlled by signals from the control logic.

* * * * *